(12) United States Patent
Miclaus (10) Patent No.: US 10,964,613 B2
(45) Date of Patent: Mar. 30, 2021

(54) ENVIRONMENTALLY PROTECTED SENSING DEVICE

(71) Applicant: InvenSense, Inc., San Jose, CA (US)

(72) Inventor: Calin Miclaus, Fremont, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/378,322

(22) Filed: Apr. 8, 2019

(65) Prior Publication Data

US 2019/0311961 A1 Oct. 10, 2019

Related U.S. Application Data

(60) Provisional application No. 62/655,047, filed on Apr. 9, 2018.

(51) Int. Cl.
| | |
|---|---|
| *H01L 23/48* | (2006.01) |
| *H01L 23/52* | (2006.01) |
| *H01L 23/04* | (2006.01) |
| *B81B 7/00* | (2006.01) |

(Continued)

(52) U.S. Cl.
CPC ............ *H01L 23/04* (2013.01); *B81B 7/0025* (2013.01); *B81B 7/0061* (2013.01); *H01L 24/09* (2013.01); *H01L 24/17* (2013.01); *H01L 24/33* (2013.01); *H01L 24/49* (2013.01); *H01L 24/73* (2013.01); *H01L 25/18* (2013.01); *H01L 2224/73204* (2013.01); *H01L 2224/73265* (2013.01)

(58) Field of Classification Search
CPC ......... H01L 23/04; H01L 24/09; H01L 24/17; H01L 24/33; H01L 24/49; H01L 24/73; H01L 25/18; B81B 7/0025

USPC .......................................................... 257/690
See application file for complete search history.

(56) References Cited

U.S. PATENT DOCUMENTS

| | | | |
|---|---|---|---|
| 5,889,212 | A | 3/1999 | Guthrie et al. |
| 6,148,673 | A | 11/2000 | Brown |
| 6,205,861 | B1 | 3/2001 | Lee |

(Continued)

FOREIGN PATENT DOCUMENTS

| | | |
|---|---|---|
| CN | 103597330 | 2/2014 |
| EP | 2717030 A1 | 9/2014 |

(Continued)

OTHER PUBLICATIONS

English Translation of the 1st Office Action and Search Report dated Aug. 31, 2020 for TW Patent Application No. 108112200. 16 pages.

(Continued)

*Primary Examiner* — David S Blum (57) ABSTRACT

A device includes a die comprising a sensor. The device also includes a substrate that is coupled to the die via the electrical coupling. The device further includes a packaging container. The packaging container and the substrate form a housing for the die. The packaging container comprises an opening that exposes at least a portion of the die to an environment external to the housing. The exposed surfaces of the die, interior of the housing, the electrical coupling, and the substrate to the environment external to the housing through the opening are coated with a conformal film. The conformal film prevents liquid, e.g., water, gas, etc., contact to the exposed surfaces of the die, the electrical coupling and the substrate.

30 Claims, 13 Drawing Sheets

(51) Int. Cl.
  *H01L 23/00* (2006.01)
  *H01L 25/18* (2006.01)

(56) References Cited

U.S. PATENT DOCUMENTS

| | | | |
|---|---|---|---|
| 6,564,642 | B1 | 5/2003 | Clifford |
| 7,516,667 | B2 | 4/2009 | Ueno |
| 8,230,743 | B2 | 7/2012 | Wade et al. |
| 9,190,352 | B2 | 11/2015 | Tiu et al. |
| 9,638,597 | B2 | 5/2017 | Hooper et al. |
| 2006/0229045 | A1 | 10/2006 | Choi et al. |
| 2007/0180916 | A1 | 8/2007 | Tian et al. |
| 2008/0038590 | A1 | 2/2008 | Nakakubo |
| 2008/0308917 | A1* | 12/2008 | Pressel ............... H01L 23/5389 257/676 |
| 2009/0026560 | A1* | 1/2009 | Wombacher ............ H01L 24/48 257/415 |
| 2009/0065916 | A1* | 3/2009 | Crane .................... H01L 24/83 257/676 |
| 2011/0316101 | A1 | 12/2011 | Dang et al. |
| 2014/0374848 | A1 | 12/2014 | Koh et al. |
| 2016/0079293 | A1* | 3/2016 | Ishii .................. H01L 27/14649 250/338.4 |
| 2017/0165715 | A1 | 6/2017 | Sudol et al. |
| 2018/0114804 | A1* | 4/2018 | Hsieh ................ H01L 27/14634 |
| 2019/0206752 | A1* | 7/2019 | Bautista, Jr. ........ H01L 23/3121 |

FOREIGN PATENT DOCUMENTS

| | | |
|---|---|---|
| TW | I420988 B | 12/2013 |
| TW | 201435320 A | 9/2014 |
| TW | 201522915 | 6/2015 |
| TW | I494812 B | 8/2015 |
| WO | 2018007641 A1 | 1/2018 |
| WO | 02/14821 A2 | 2/2020 |

OTHER PUBLICATIONS

Notification Concerning Transmittal of Copy of International Preliminary Report of Patentability (Chapter 1 of the Patent Cooperation Treaty) Oct. 22, 2020 PCT Application No. PCT/US2019/026309 8 pages.

* cited by examiner

ENVIRONMENTALLY PROTECTED SENSING DEVICE

RELATED APPLICATIONS

The instant application is non-provisional patent application and claims the benefit and priority to a U.S. Provisional Application 62/655,047 filed on Apr. 9, 2018, which is incorporated herein by reference in its entirety.

BACKGROUND

Many electronic devices are used in various conditions and are exposed to different external environments. For example, many electronic devices such as sensors may come in contact with the external environment such as water, gas, etc., that may be damaging to the sensing device. Conventionally, the package cavity of the electronic device is increased and filled with gel. The gel protects the electronic device from being damaged. Unfortunately, increasing the package cavity to fill it with gel increases the package size, which increases the cost. Furthermore, increasing the package size cuts against the goal of miniaturizing the electronic devices to achieve a smaller footprint and formfactor.

Filling the package cavity with gel also impacts the performance of many electronic devices, such as sensors due to aging over time. Additionally, filling the package cavity with gel may impact the performance of the electronic device, such as a sensor, by adding more mass and making the electronic device susceptible to damage during mounting.

SUMMARY

Accordingly, a need has arisen to protect the electronic device from being exposed to the external environment, e.g., water, gas, etc., without increasing the package dimension. Moreover, a need has arisen to protect the electronic device from being exposed or damaged, resulting from exposure to the external environment, without using gel, thereby maintaining the performance of the device. According to some embodiments, a conformal film is deposited on the electronic device or the desired components in order to protect the electronic device or the desired components from being exposed to the external environment. It is appreciated that the conformal film may be deposited after the device is assembled and before calibration, thereby simplifying the manufacturing process and cost.

In some embodiments, a device includes a die comprising a sensor. The device also includes a substrate that is coupled to the die via the electrical coupling. The device further includes a packaging container. The packaging container and the substrate form a housing for the die. The packaging container comprises an opening that exposes at least a portion of the die to an environment external to the housing. The exposed surfaces of the die, interior of the housing, the electrical coupling, and the substrate to the environment external to the housing through the opening are coated with a conformal film. The conformal film prevents liquid, e.g., water, gas, etc., contact to the exposed surfaces of the die, the electrical coupling and the substrate.

It is appreciated that in some embodiments the packaging container may be attached to the substrate by an attach material. In some embodiments, the attach material is coated with a conformal film. According to some embodiments, a thickness of the conformal film ranges between 10 Å and 5 micron meters. The conformal film is selected from a group consisting of Parylene or polymer comprising glass powder, or ceramic powder.

In some embodiments, the die may be coupled to the substrate using a die attach material. In some embodiments, the electrical coupling comprises a wire bond configured to electrically connect the die to the substrate. According to some embodiments, the die is a flip chip and the electrical coupling comprises a solder for coupling the die to the substrate.

The sensor may be selected from a group consisting of a pressure sensor, a microphone, or a temperature sensor. In some embodiments, the device further includes an attachment coupled to device. The attachment may be selected from a group consisting of a gasket or an O-ring. The attachment may be configured to integrate the device into a second device and further to isolate interior of the second device from external environment.

These and other features and aspects of the concepts described herein may be better understood with reference to the following drawings, description, and appended claims.

DETAILED DESCRIPTION

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

A need has arisen to protect the electronic device from being exposed to the external environment, e.g., liquids such as water, gas, etc., without increasing the package cavity. Moreover, a need has arisen to protect the electronic device from being exposed or damaged, resulting from exposure to the external environment, without using gel, thereby maintaining the performance of the device.

According to some embodiments, a conformal film is deposited on the electronic device or the desired components in order to protect the electronic device or the desired components from being exposed to the external environment. It is appreciated that the conformal film may be deposited after the device is fully assembled and before calibration, thereby simplifying the manufacturing process and cost. In other words, the cost is minimal since the fully assembled device is coated with a conformal film, post processing.

The use of conformal film may achieve waterproofing the device at high water depths, e.g., greater than 1.5 m. It is appreciated that the embodiments are described with respect to waterproofing the electronic device, however, the embodiments should not be construed as limited thereto. For example, using conformal film may protect the device against any external environment, e.g., gas, liquid, etc. It is appreciated that the device may be a sensor, e.g., a pressure sensor, a microphone, speaker, temperature sensor, etc., or it may be a medical device ingestible by a patient where the device becomes exposed to the internal environment within the human body.

Figure 1:
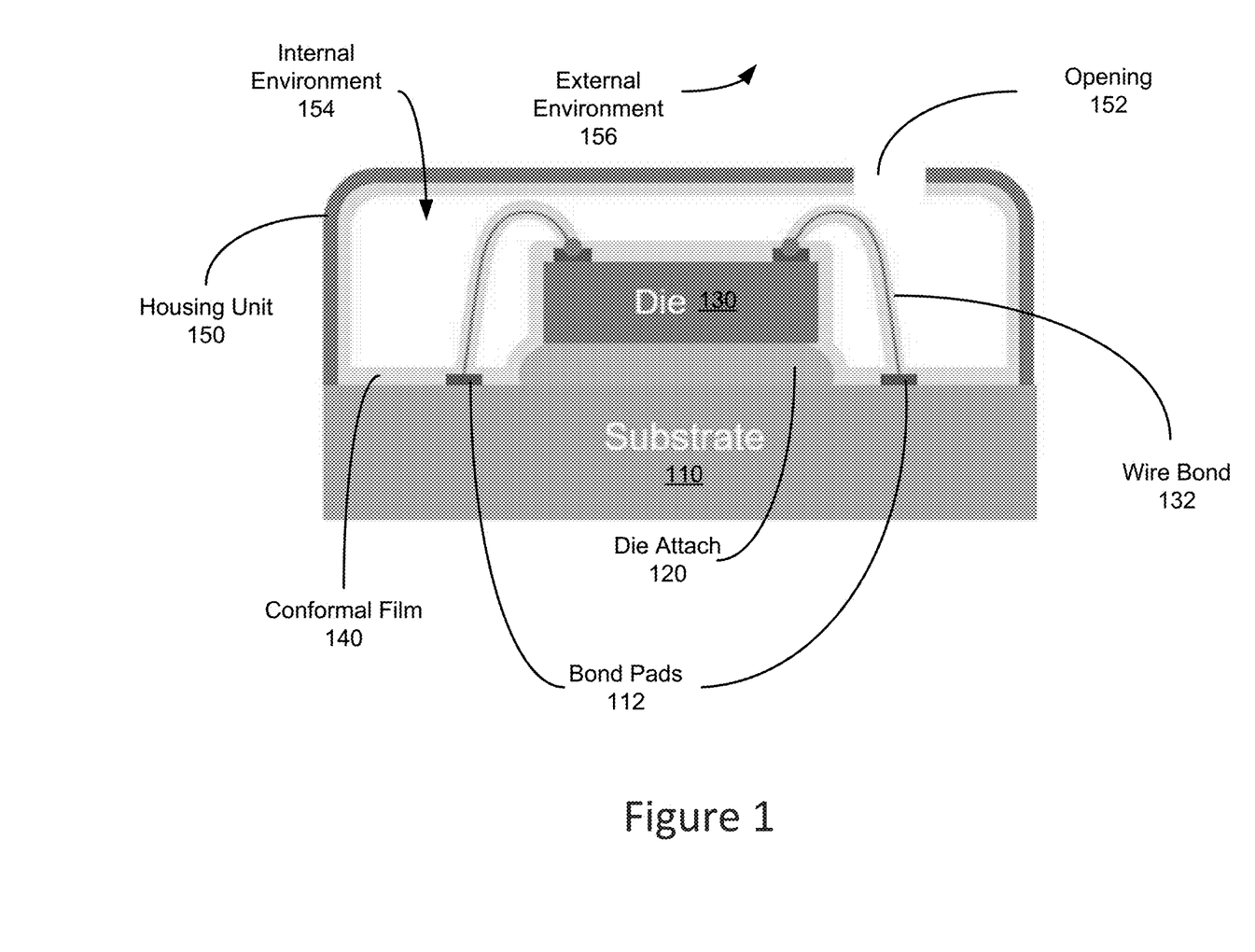
FIG. 1 shows a single die device in accordance with some embodiments.

Referring now to FIG. 1, a single die device in accordance with some embodiments is shown. The device includes a substrate 110 and a die 130 that is attached to the substrate 110 using a die attach 120 material. Die attached 120 provides mechanical attached. Die attach material 120 may be any one of e.g., soft adhesive, soft silicon glue, RTV, epoxy, etc. In some embodiments the substrate can be a PCB or similar package substrate. It is appreciated that in some embodiments, the die 130 may be electrically coupled to the substrate 110 using electrical coupling. The die 130 may be a sensor, e.g., pressure sensor, temperature sensor, microphone sensor, etc. In this embodiment, the electrical coupling is via wire bond 132 that electrically couples the die 130 to the bond pads 112 positioned on the substrate 110. The housing unit 150 may be attached to the substrate 110 to form a housing for the die 130. In some embodiments, the housing unit 150 is attached to the substrate 110 via attach material, e.g., solder, epoxy glue, etc. The housing unit 150 may include an opening 152 that exposes the die 130 to the external environment 156 of the device even though the die 130 is positioned within the internal environment 154 of the housing unit 150. It is appreciated that in some embodiments, the housing unit 150 may be a packaging container for housing the electronic components, e.g., sensor, die, etc., therein.

It is appreciated that in order to protect the device and electronic components within from the external environment, the exposed surfaces may be coated with a conformal film 140. The conformal film 140 may be Parylene or polymer comprising glass powder, or ceramic powder. The thickness of the conformal film 140 may be less than 5 micro meters. In some embodiments, the thickness of the conformal film 140 may be between 10 Å and 5 micro meters. It is appreciated that the conformal film 140 may be applied through a vapor deposition process. According to some embodiments, the conformal film 140 has a uniform thickness. However, it is appreciated that in some embodiments, various portions of the conformal film 140 may have different thicknesses.

According to some embodiments, the conformal film 140 is deposited over the exposed surfaces, e.g., die 130, die attach 120, substrate 110, bond pads 112, wire bonds 132, interior of the housing unit 150, attach material, or any combination thereof. It is further appreciated that in some embodiments, a portion or all of the exterior surface of the housing unit 150 may also be coated with the conformal film 140 (not shown here). Depositing the conformal film 140 waterproofs and protects the electronics or any sensitive electronic components from being exposed to the external environment 156 such as water, gas, or other liquids.

It is appreciated that in the illustrated embodiment, the housing unit 150 coupled to the substrate 110 forms a housing for the electronic components therein. However, it is appreciated that in some embodiments, the housing unit 150 may further house and hold the exterior surfaces, e.g., bottom surface, side surfaces, etc., of the substrate 110 (not shown here but shown in FIGS. 4B, 5B, 6B).

Figure 2:
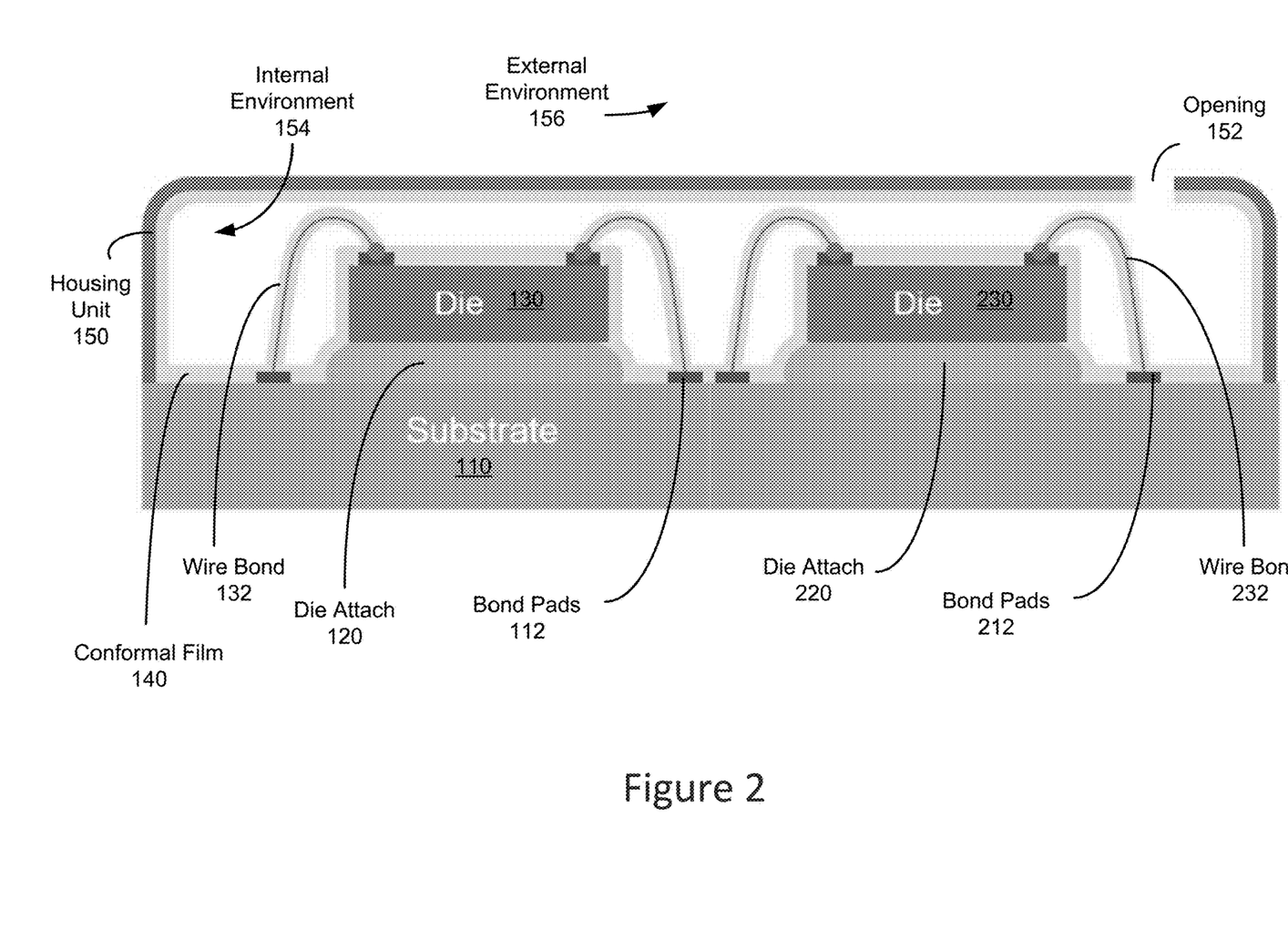
FIG. 2 shows a two die device that are horizontally positioned in accordance with some embodiments.

Referring now to FIG. 2, a two die device that are horizontally positioned in accordance with some embodiments is shown. FIG. 2 is substantially similar to that of FIG. 1. In this embodiment, a second die 230 is coupled to the substrate 110 via a die attach 220. The die attach 220 may be similar to die attach 120, in some embodiments. It is appreciated that the die 130 may be a sensor, as described above, while die 230 may be a different sensor or any other type of electronic devices, e.g., a CMOS, etc.

In this embodiment, the die 230 may be electrically coupled to the substrate 110 via wire bond 232 and bond pads 212. It is appreciated that die 130 and 230 are vertically coupled to the substrate 110 but are positioned horizontally with respect to one another. Moreover, it is appreciated that even though both, die 130 and 230, are coupled to the substrate 110 using wire bonds 132, 232 and bond pads 112, 212, the embodiments should not be construed as limited thereto. For example, die 230 may be a flip chip and electrically coupled to the substrate 110 via solder balls while die 130 may be electrically coupled to the substrate 110 via wire bond 132 and bond pads 112.

As discussed with respect to FIG. 1, various exposed surfaces, e.g., interior surface of the housing unit 150, the exposed surfaces of the substrate 110, the exposed surfaces of the die attach 120 and 220, the exposed surfaces of the die 130 and 230, the exposed surfaces of the wire bonds 132 and 232, the exposed surfaces of the bond pads 112 and 212, or any combination thereof, are coated with the conformal film 140. It is appreciated that in some embodiments, at least a portion of the exterior surface of the housing unit 150 is also coated with the conformal film 140. Accordingly, the conformal film 140 formed over the exposed surfaces forms a protecting layer against the external environment 156, e.g., water, air, or other liquids and gases.

Figure 3:
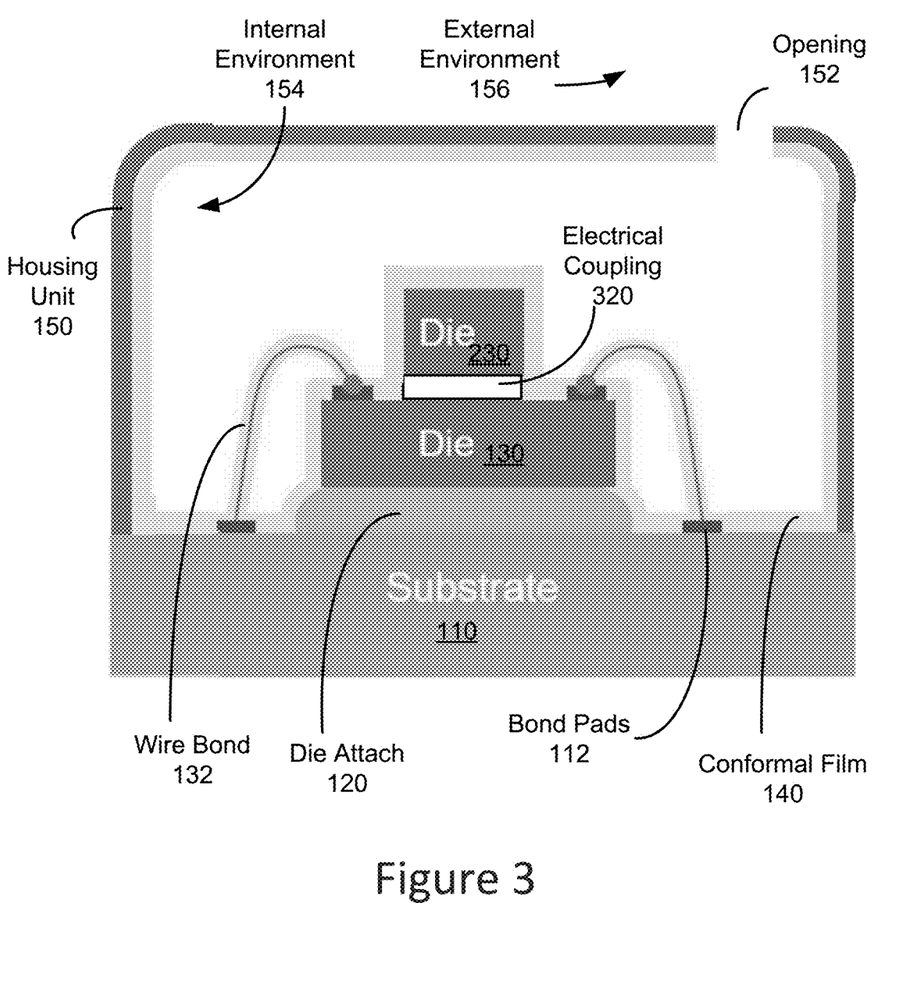
FIG. 3 shows a two die device that are vertically stacked in accordance with some embodiments.

Referring now to FIG. 3, a two die device that are vertically stacked in accordance with some embodiments is shown. FIG. 3 shows an embodiment similar to that of FIG. 2 except that die 230 is vertically coupled to die 130, which is vertically coupled to the substrate 110. The die 230 may be electrically coupled to the die 130 via an electrical coupling 320. The electrical coupling 320 may be a wire bond or via a flip chip structure through solder balls. It is appreciated that the electrical coupling 320 may also include a die attach material to attach the die 230 to die 130. In some embodiments, die 230 may be electrically coupled to the substrate 110, e.g., through wire bond, etc., without a direct electrical connection with die 130 (not shown). In certain alternate embodiments, wire bonds can be replaced by electrical coupling 320. In some embodiments, die 230 is attached to die 130 via a die attach material while the electrical connection from die 230 to substrate is made by additional wire bonds.

Figure 4A:
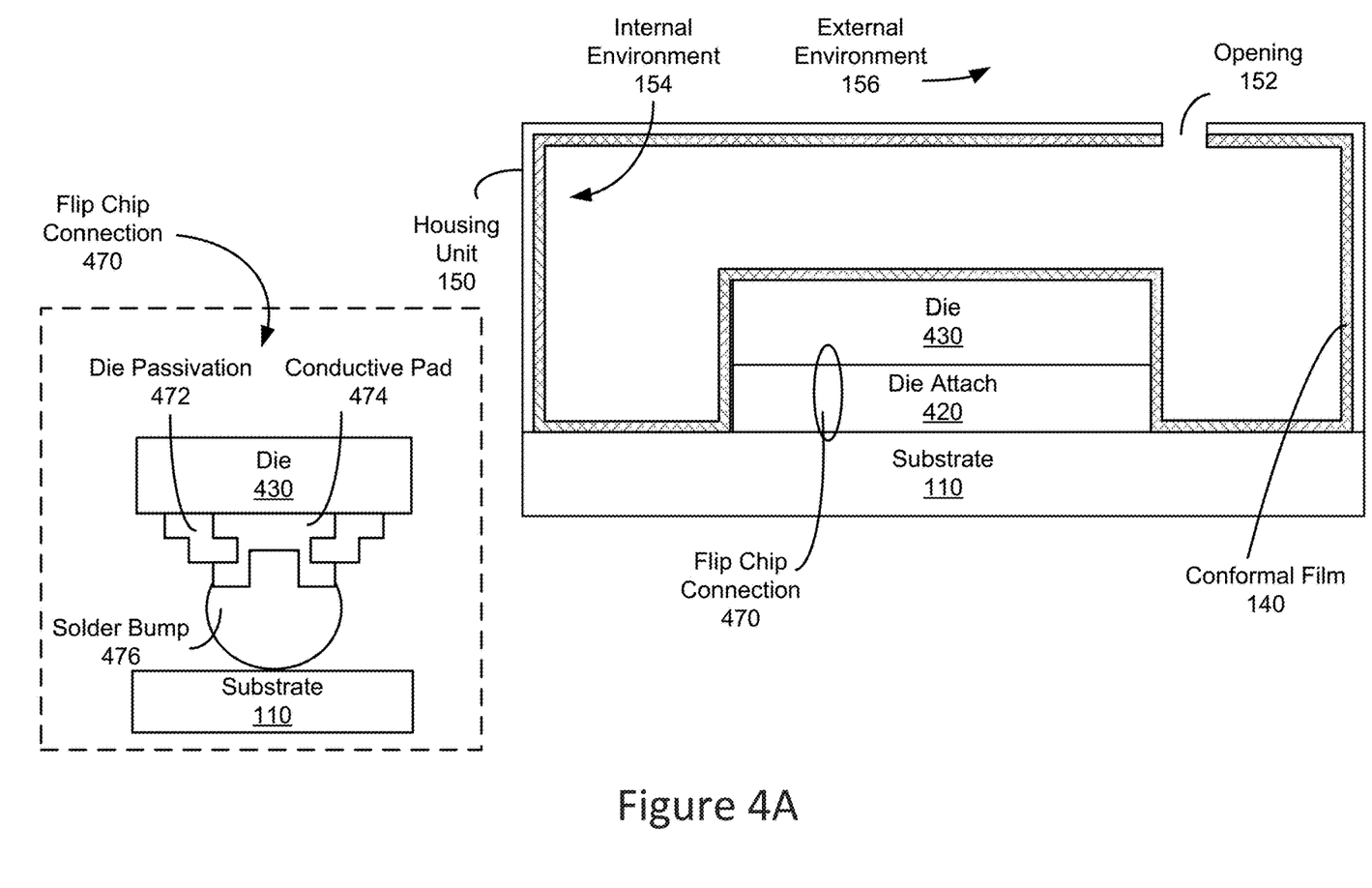
FIGS. 4A-4B show a flip chip die device in accordance with some embodiments.
Figure 4B:
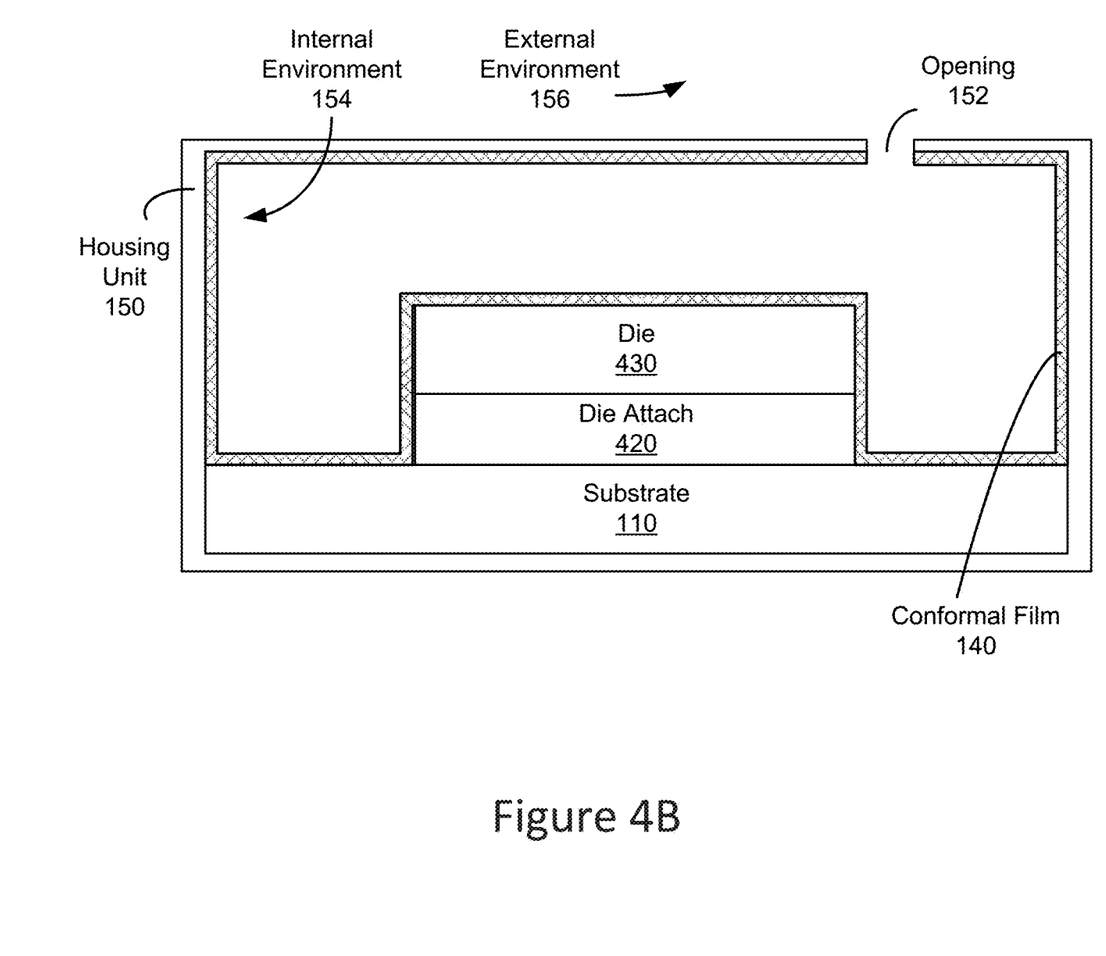

Referring now to FIGS. 4A-4B, a flip chip die device in accordance with some embodiments is shown. FIG. 4A is similar to that of FIG. 1. In this embodiment, the die 430 may be a sensor, as discussed above, and it may be coupled to the substrate 110 via a die attach 420. However, in this embodiment, the die 430 may be a flip chip and electrically and mechanically connected to the substrate through die attach 420. More specifically the flip chip connection 470 connects the die 430 to the substrate 110. In some embodiments, the flip chip connection 470 includes a conductive pad 474 for electrically connecting the die 430 to the substrate 110. A die passivation layer 472 overlays the die 430 and the conductive pad 474. Solder bumps 476 are formed over the conductive pad 474. Optionally, die attach 420 can include mechanical attachment such as RTV or other soft material in addition to solder balls. FIG. 4B is similar to FIG. 4A except that the housing unit 150 houses at least some of the exterior surfaces of the substrate 110, e.g., bottom surface, side surfaces, or any combination thereof, etc. In this embodiment, the housing unit 150 along with the die 430, die attach 420, and the conformal film 140 encapsulates the substrate 110.

Figure 5A:
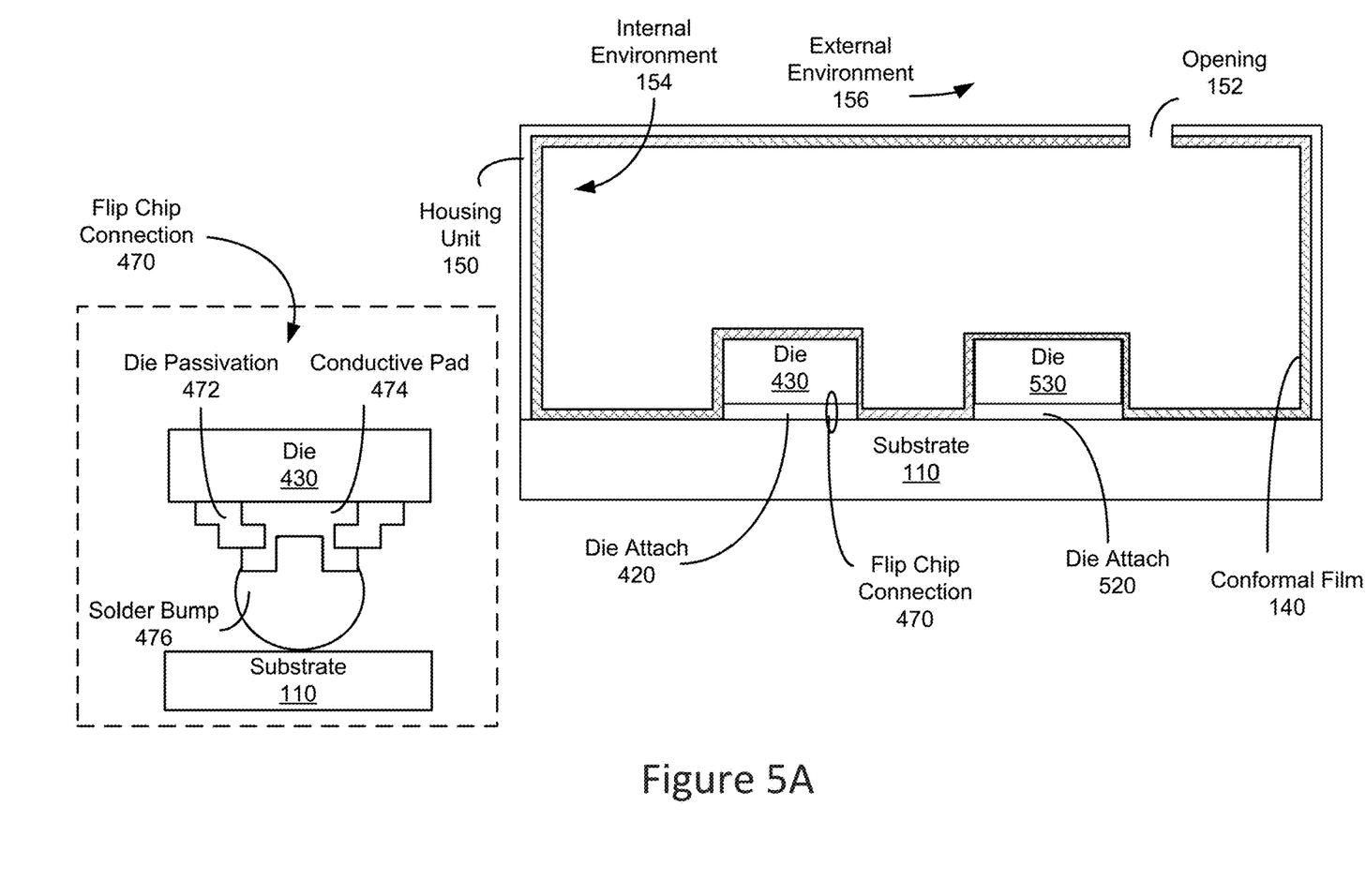
FIGS. 5A-5B show a two flip chip dies horizontally positioned in accordance with some embodiments.
Figure 5B:
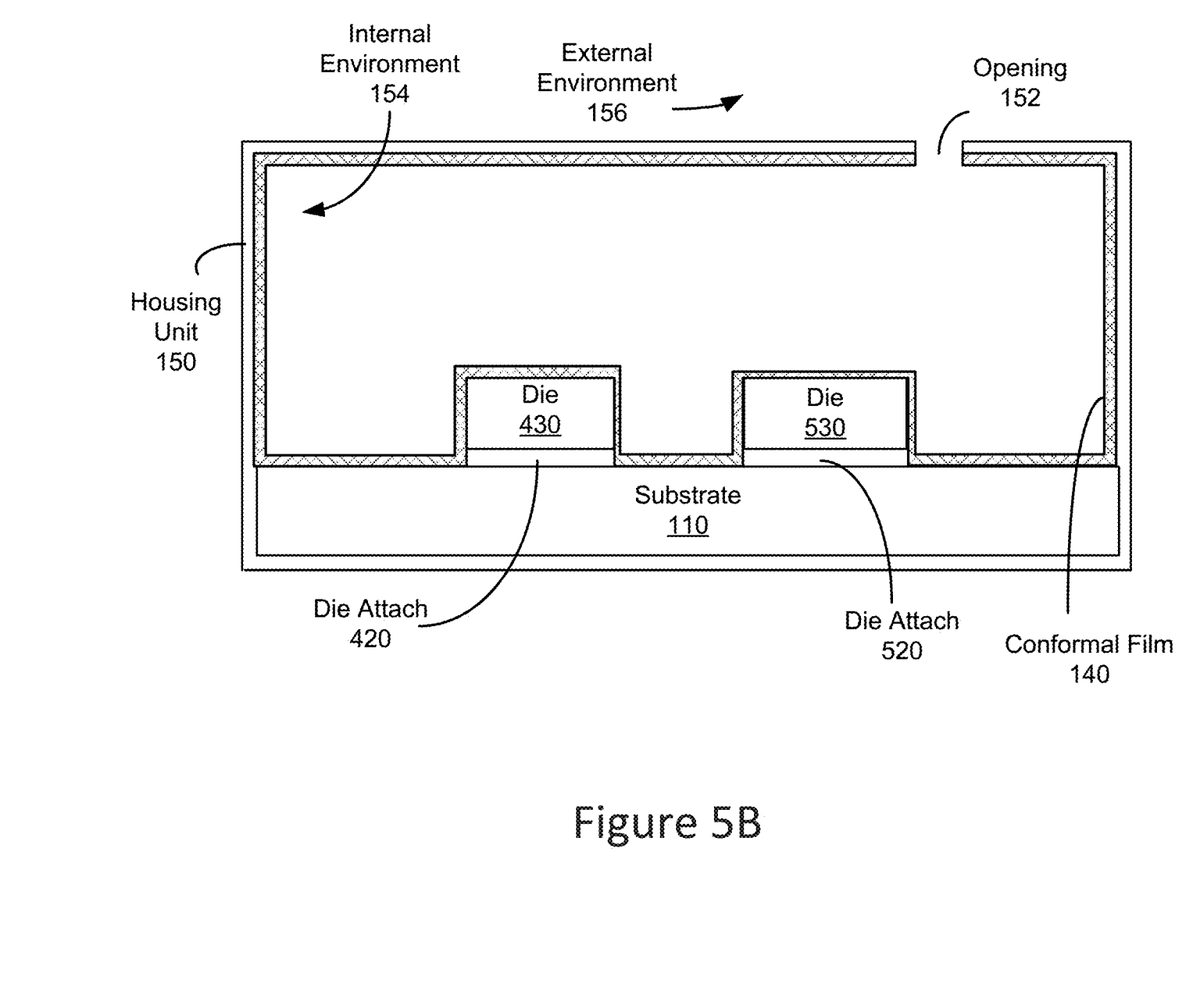

Referring now to FIGS. 5A-5B, two flip chip dies horizontally positioned in accordance with some embodiments is shown. FIG. 5A is similar to that of FIGS. 2 and 4A. In this embodiment, die 530 is coupled to the substrate 110 via die attach 520. The die attach 520 may be similar to die attach 120, as described above. It is appreciated that die 430 and die 530 are flip chip devices and are electrically coupled to the substrate 110 via solder balls. It is appreciated that die 530 may electrically connect to the substrate 110 similar to the flip chip connection 470 of die 430. However, it is appreciated that in some embodiments, one die may be electrically coupled in a different fashion. For example, one die may be a flip chip device and electrically connected via solder balls while another die may be electrically connected via wire bonds and bond pads. FIG. 5B is similar to FIG. 5A except that the housing unit 150 houses at least some of the exterior surfaces of the substrate 110, e.g., bottom surface, side surfaces, or any combination thereof, etc. In this embodiment, the housing unit 150 along with the die 430 and 530, die attach 420 and 520, and the conformal film 140 encapsulates the substrate 110.

Figure 6A:
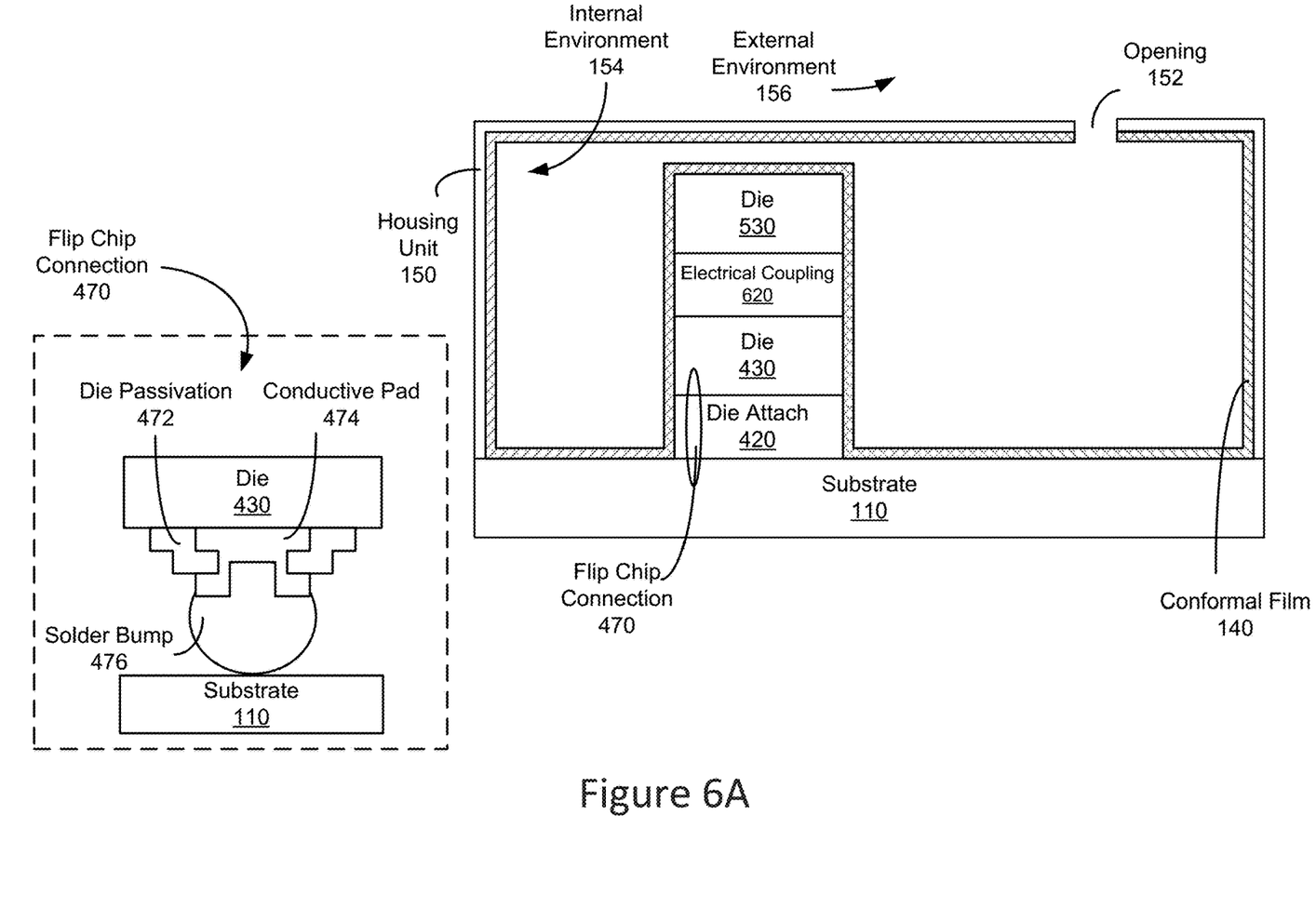
FIGS. 6A-6B show a two flip chip dies that are vertically stacked in accordance with some embodiments.
Figure 6B:
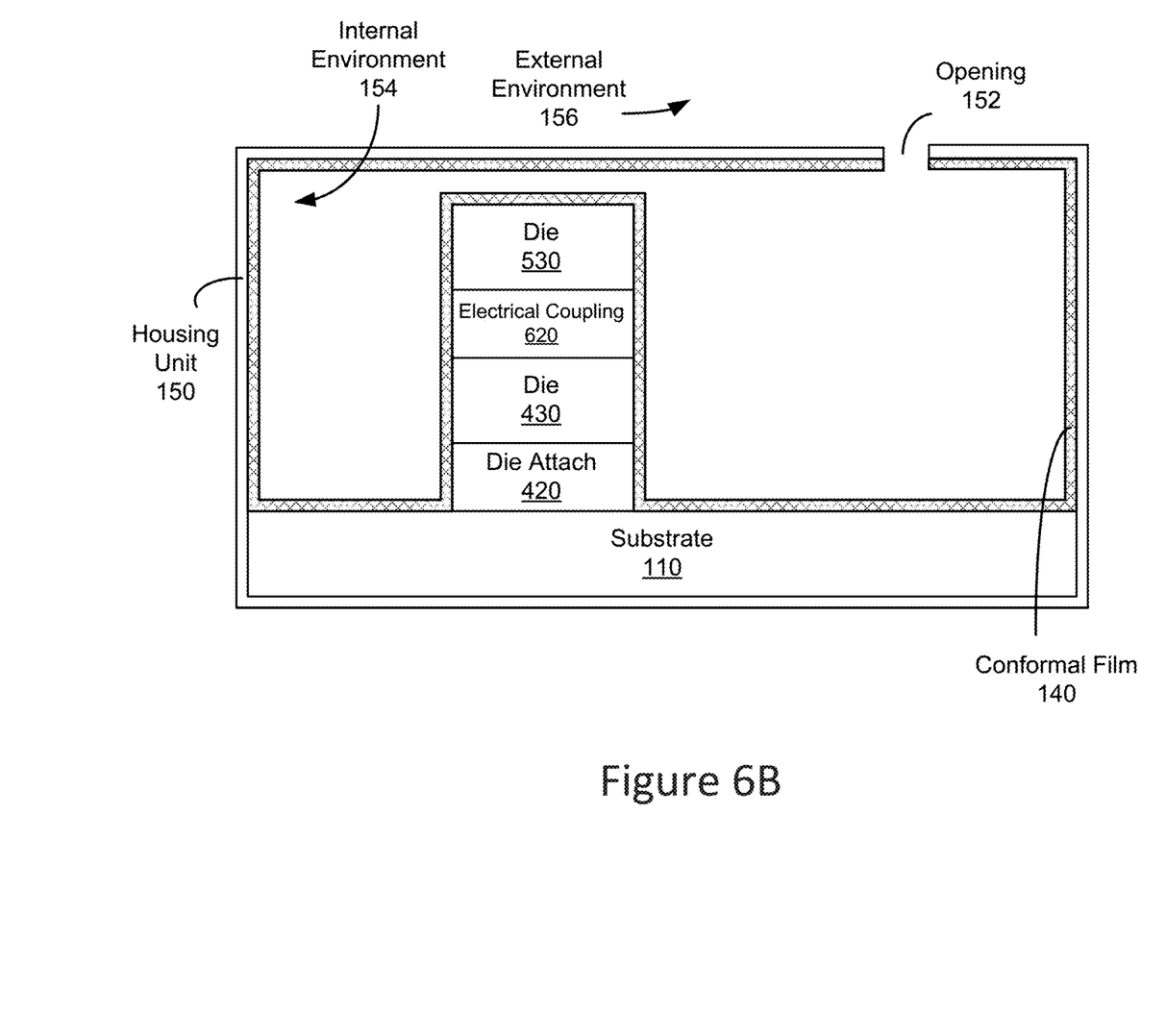

Referring now to FIGS. 6A-6B, a two flip chip dies that are vertically stacked in accordance with some embodiments is shown. FIG. 6A is similar to that of FIGS. 3 and 4A. In this embodiment, die 530 is vertically stacked on die 430. Die 530 is electrically coupled to the die 430 via electrical coupling 620. In some embodiments, the electrical coupling 620 includes a die attach material for connecting the die 530 to the die 430. It is appreciated that die 430 and die 530 are flip chip devices. Die 530 is electrically coupled to the die 430 via solder balls while die 430 is electrically coupled to the substrate 110 via solder balls. It is appreciated that die 530 may electrically connect to the die 430 similar to the flip chip connection 470 of die 430. However, it is appreciated that in some embodiments, one die may be electrically coupled in a different fashion. For example, one die may be a flip chip device and electrically connected via solder balls while another die may be electrically connected via wire bonds and bond pads. In some embodiments, die 530 may be electrically coupled to die 430 via solder balls while die 430 may be electrically coupled to the substrate 110 via wire bonds and wire pads. FIG. 6B is similar to FIG. 6A except that the housing unit 150 houses at least some of the exterior surfaces of the substrate 110, e.g., bottom surface, side surfaces, or any combination thereof, etc. In this embodiment, the housing unit 150 along with the die 430 and 530, die attach 420, electrical coupling 620, and the conformal film 140 encapsulates the substrate 110.

Figure 7:
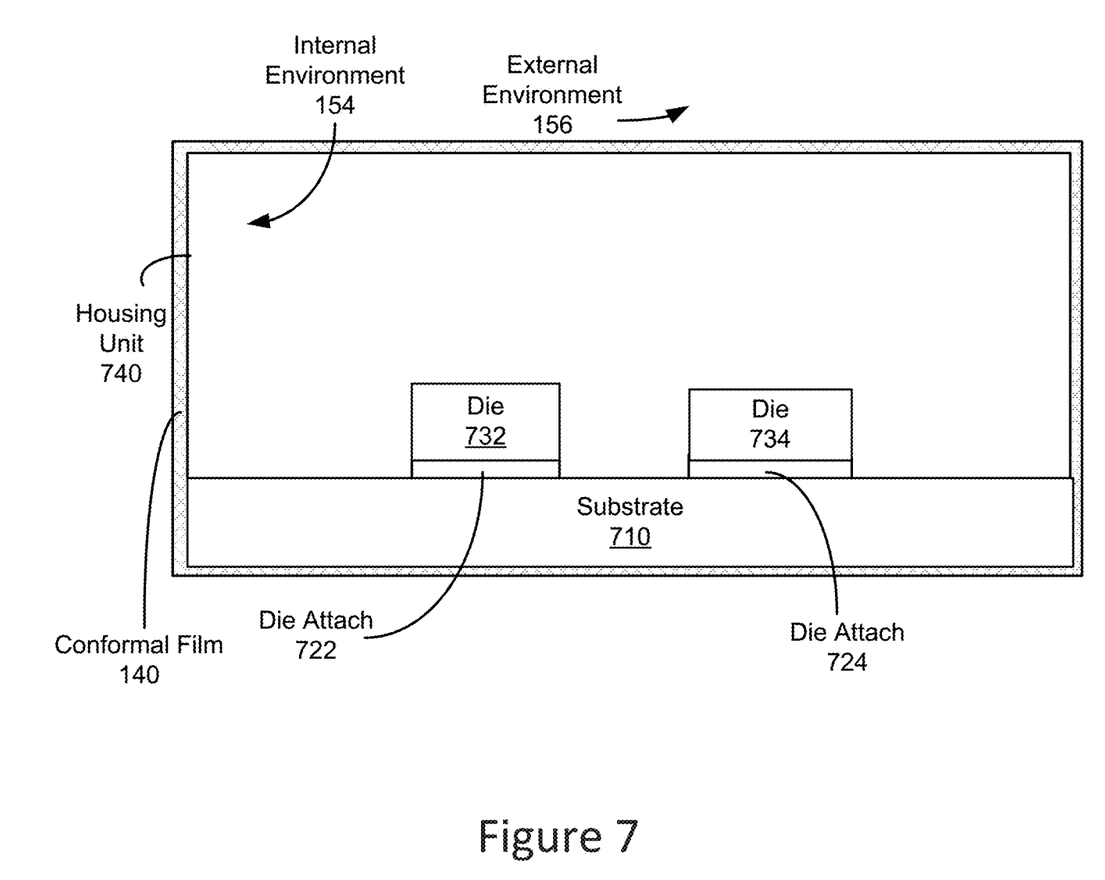
FIG. 7 shows an isolated two flip chip die device horizontally positioned in accordance with some embodiments.

Referring now to FIG. 7, an isolated two flip chip die device horizontally positioned in accordance with some embodiments is shown. FIG. 7 is similar to FIG. 5A where die 732 and 734, are similar to die 430 and 530, and are positioned horizontally with respect to one another and vertically on the substrate 710. The substrate 710 may be similar to the substrate 110, described above. Die 732 is coupled to the substrate 710 via die attach 722 and die 734 is coupled to the substrate 710 via die attach 724. Die attach 722 and 724 are similar to die attach 420 and 520, as described above. In some embodiments, the die 732 and 734 are flip chip devices and make electrical connection to the substrate 710 using solder bumps, similar to those described in FIGS. 4A, 5A, and 6A. In this embodiment, the housing unit 740 may completely surround the die 732 and 734. In other words, unlike other embodiments with an opening, as described above, FIG. 7 illustrates an embodiment where the electronic components within the housing unit 740 are not exposed to the external environment 156 by completely encapsulating it. As such, the device as described in FIG. 7 may be suitable for use as an ingestible medical device to protect the internal electronic components from the external environment, e.g., internal environment within the human body. The exterior of the housing unit 740 may be coated with the conformal film 140, thereby protecting the housing from being exposed to the external environment 156. It is appreciated that in some embodiments, die 732 and/or die 734 may be electrically coupled to the substrate 710 using wire bonds and bond pads (not shown). It is appreciated that while the conformal film illustrated as a continuous film, in some embodiments, the conformal film may have one or more discontinuity in them, e.g., electrical connection for connecting to other devices, etc.

Figure 8:
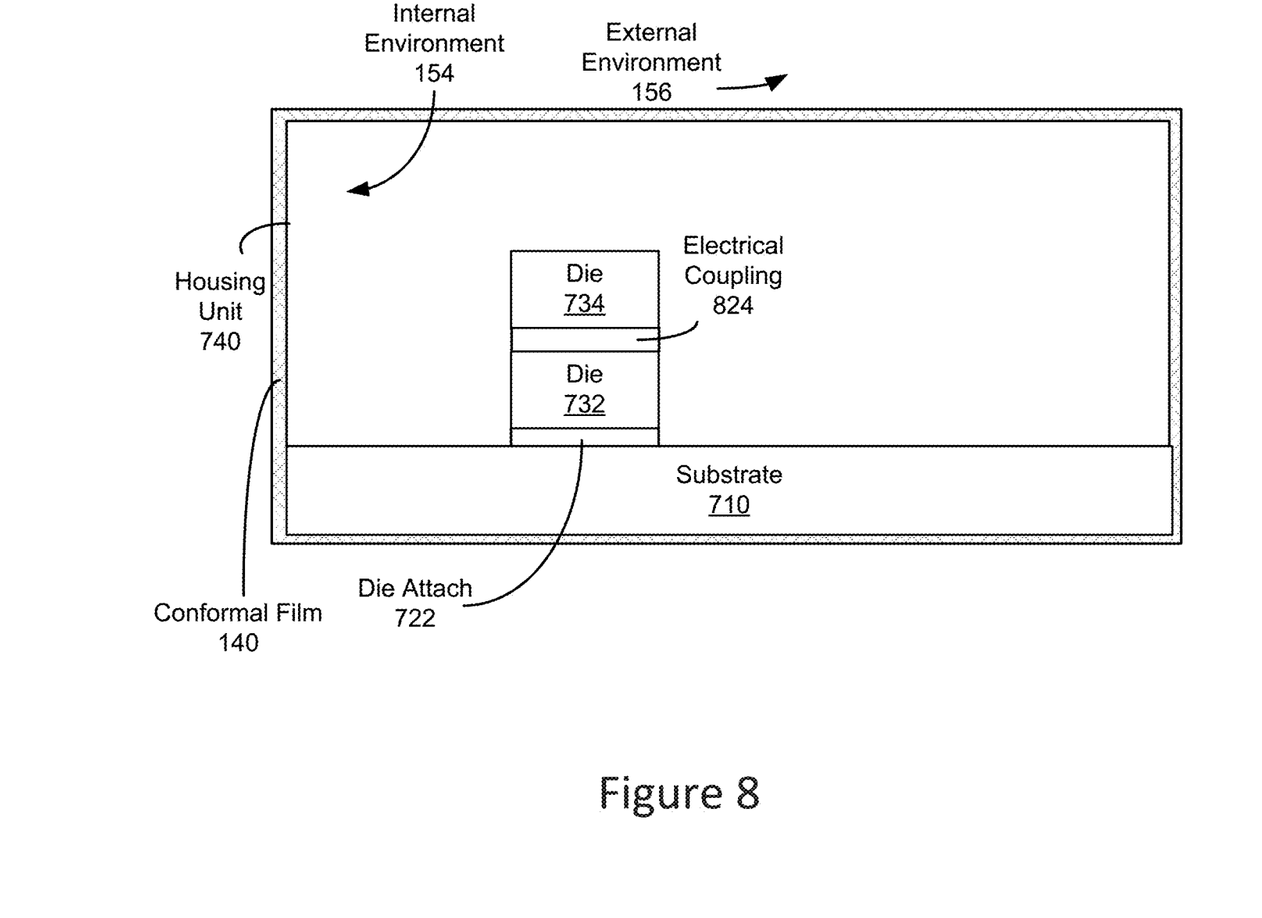
FIG. 8 shows an isolated two flip chip die device that are vertically stacked in accordance with some embodiments.

Referring now to FIG. 8, an isolated two flip chip die device that are vertically stacked in accordance with some embodiments is shown. FIG. 8 is similar to FIG. 7 except that die 734 and 732 are stacked vertically, as described with respect to FIGS. 3 and 6A. In some embodiments, die 734 is electrically coupled to the die 732 via electrical coupling 824. Electrical coupling 824 may be similar to other electrical couplings described above with respect to FIGS. 1-7. It is appreciated that die 734 may electrically connect to the die 732 similar to the flip chip connection 470 of die 430. It is appreciated that while the conformal film illustrated as a continuous film, in some embodiments, the conformal film may have one or more discontinuity in them, e.g., electrical connection for connecting to other devices, etc.

It is further appreciated that FIGS. 1-8 have been described with respect to one die and one substrate or two dies and one substrate. However, the description of the embodiments with respect to one or two dies is for illustrative purposes and not intended to limit the scope. For example, in some embodiments three or more dies may be used.

Figure 9A:
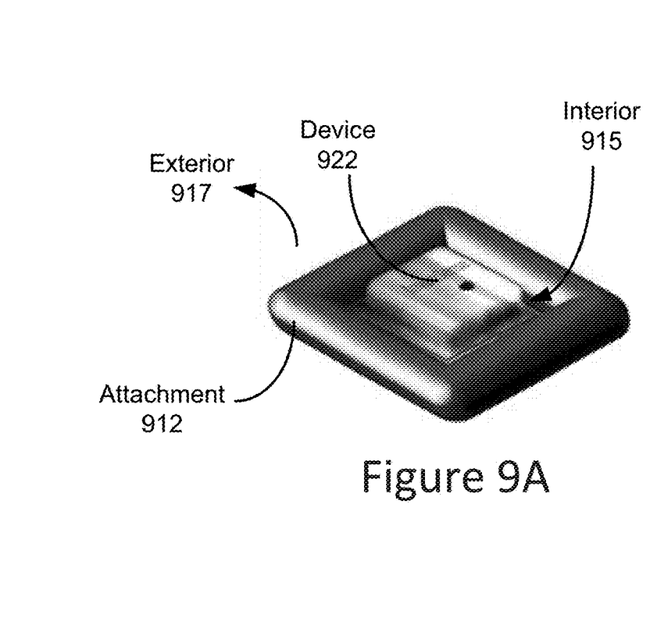
FIGS. 9A-9D show attachment coupled devices in accordance with some embodiments.
Figure 9B:
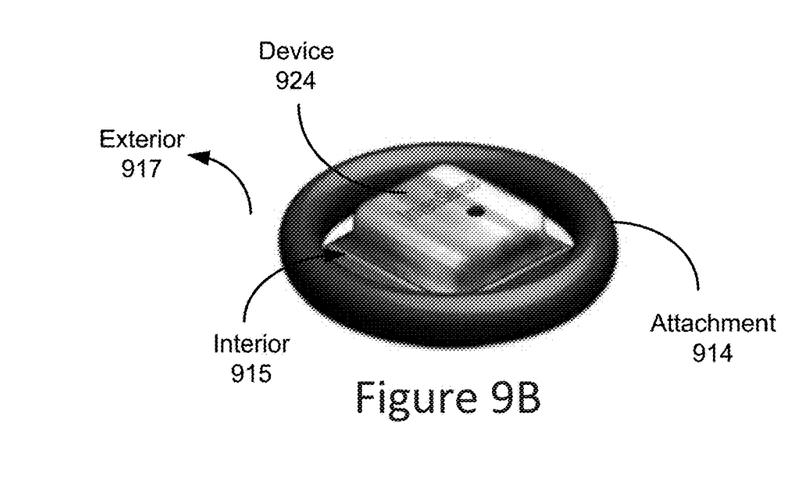
Figure 9C:
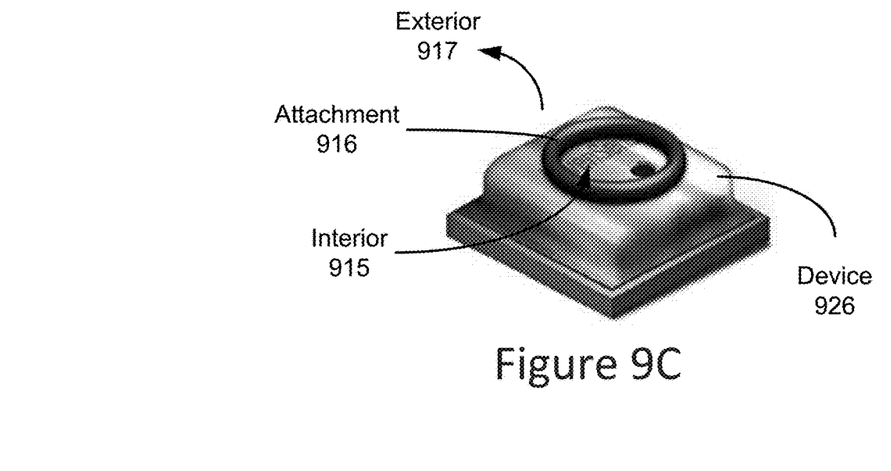
Figure 9D:
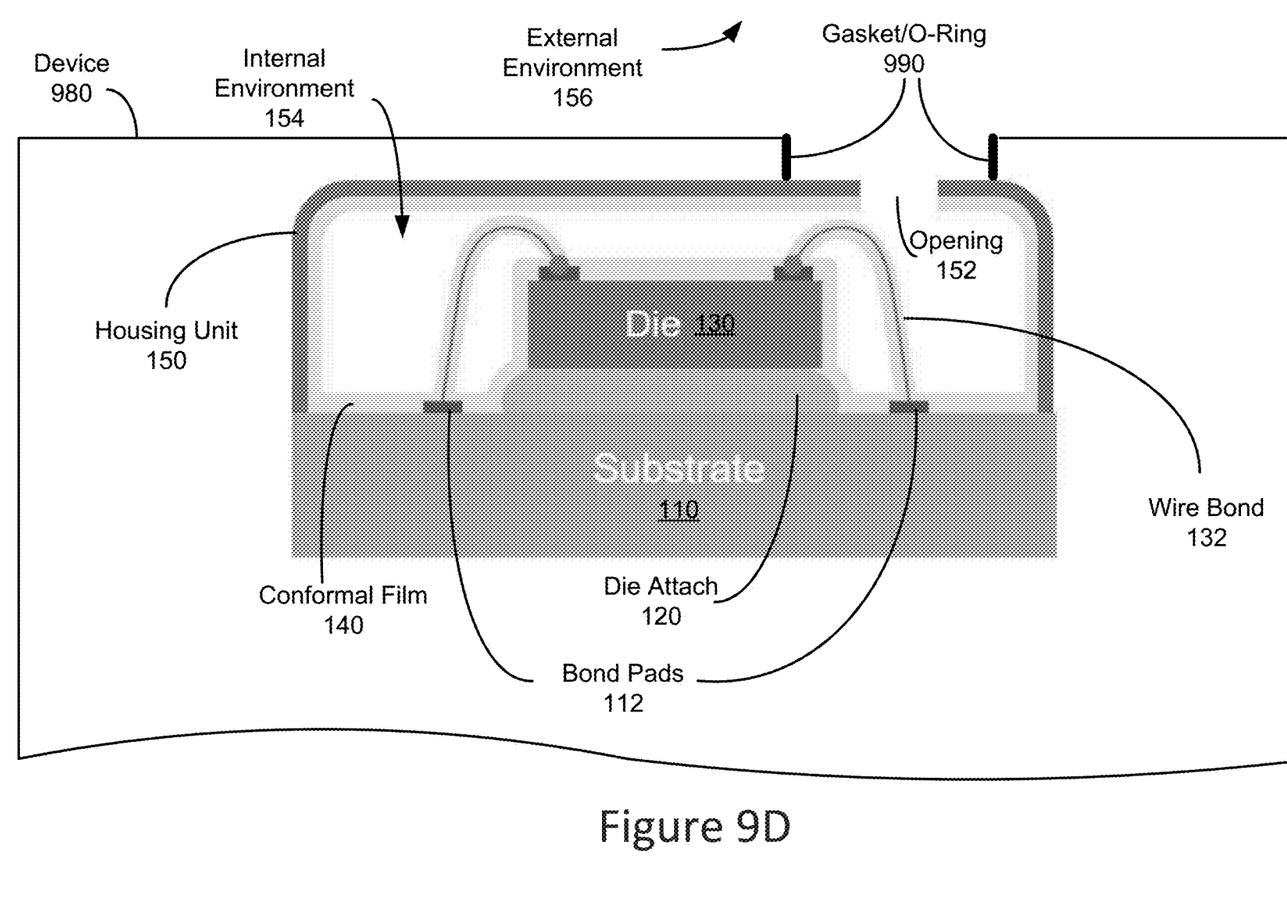

Referring now to FIGS. 9A-9C, attachment coupled devices in accordance with some embodiments is shown. FIG. 9A shows a device 922 similar to that described above with respect to FIGS. 1-8. An attachment 912, e.g., a gasket, may be formed on the outside of the device 922 to form an interior 915 portion separating the device 922 from the exterior 917 portion. The attachment 912 enables the device 922 to be integrated as a single device. The attachment 912 further isolates the interior 915 from the external environment, e.g., exterior 917. FIG. 9B is similar to FIG. 9A. In this embodiment, the device 924 is similar to that described above with respect to FIGS. 1-8. An attachment 914, e.g., an O-ring, may be formed on the outside of the device 924 to form an interior 915 portion separating the device 922 from the exterior 917 portion. The attachment 914 enables the device 924 to be integrated as a single device. The attachment 914 further isolates the interior 915 from the external environment, e.g., exterior 917. FIG. 9C is similar to FIG. 9A. In this embodiment, the device 926 is similar to that described above with respect to FIGS. 1-8. An attachment 916, e.g., an O-ring, may be formed on the upper surface of the device 926 to form an interior 915 portion separating the device 926 from the exterior 917 portion. The attachment 916 enables the device 926 to be integrated as a single device. The attachment 916 further isolates the interior 915 from the external environment, e.g., exterior 917. FIG. 9D, illustrates an exemplary cross section of a sensor device, as described above, integrated within another device 980 with the attachment, e.g., gasket/O-ring 990. It is appreciated that the gasket/O-ring 990 is shown with thicker lines to delineate it from the device 980. The gasket/O-ring 990 prevents the internal environment of the device 980 to be exposed to the external environment 156.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A device comprising:
   a first die comprising a sensor;
   a second die;
   an electrical coupling;
   a substrate coupled to the first die and the second die, wherein the first die is coupled to the second die via the electrical coupling; and
   a housing unit, wherein the housing unit and the substrate are configured to house the first die, the electrical coupling, and the second die, wherein the housing unit and the substrate form an enclosure, and wherein the housing unit comprises an opening that exposes at least a portion of the first die, interior of the housing, the electrical coupling and the second die to an environment external to the housing unit,
   wherein exposed surfaces of the first die, interior of the housing unit, the electrical coupling, the second die, and the substrate, to the environment external to the housing unit through the opening are coated with a conformal film, wherein the conformal film prevents liquid contact to the exposed surfaces of the first die, the interior of the housing, the electrical coupling, second die, and the substrate.

2. The device of claim 1, wherein the housing unit is attached to the substrate using an attach material, and wherein the attach material is coated with the conformal film.

3. The device of claim 1 further comprising wire bond for coupling the first die to a bond pad on the substrate, wherein the wire bond and the bond pad are coated with the conformal film.

4. The device of claim 1, wherein a thickness of the conformal film is less than 5 micro meters.

5. The device of claim 1, wherein the conformal film is selected from a group consisting of Parylene or polymer comprising glass powder, or ceramic powder.

6. The device of claim 1, wherein the first die is coupled to the second die vertically and wherein the first die and the second die are further coupled to the substrate vertically.

7. The device of claim 1, wherein the first die is coupled to the second die in a horizontally through the substrate, wherein the first die is coupled to the substrate vertically and wherein the second die is coupled to the substrate vertically.

8. The device of claim 1 further comprising a die attach material configured to couple the first die to the substrate or first die to the second die.

9. The device of claim 8, where in the die attach material is coated with a conformal film.

10. The device of claim 1, wherein the electrical coupling further comprises a wire bond configured to electrically connect the first or the second die to the substrate.

11. The device of claim 1, wherein the first die is a flip chip, and wherein the electrical coupling comprises solder balls to electrically connect the first die to the substrate.

12. The device of claim 1, wherein the sensor is selected from a group consisting of a pressure sensor, a microphone, or a temperature sensor.

13. The device of claim 1 further comprising an attachment coupled to device, wherein the attachment is selected from a group consisting of a gasket or an O-ring, and wherein the attachment is configured to integrate the device into a second device and further to isolate the interior of the second device from external environment.

14. The device of claim 1, wherein at least an exterior portion of the housing unit is coated with a conformal film.

15. A device comprising:
   a die comprising a sensor;
   an electrical coupling;
   a substrate coupled to the die via the electrical coupling; and
   a packaging container, wherein the packaging container and the substrate form an enclosed housing for the die, and wherein the packaging container comprises an opening that exposes at least a portion of the die to an environment external to the housing, wherein exposed surfaces of the die, interior of the housing, the electrical coupling, and the substrate to the environment external to the housing through the opening are coated with a conformal film, wherein the conformal film prevents liquid contact to the exposed surfaces of the die, the electrical coupling and the substrate.

16. The device of claim 15, wherein the packaging container is attached to the substrate by an attach material, and wherein the attach material is coated with a conformal film.

17. The device of claim 15, wherein a thickness of the conformal film ranges between 10 Å and 5 micron meters.

18. The device of claim 15, wherein the conformal film is selected from a group consisting of Parylene or polymer comprising glass powder, or ceramic powder.

19. The device of claim 15 further comprising a die attach material configured to couple the die to the substrate.

20. The device of claim 15, wherein the electrical coupling comprises a wire bond configured to electrically connect the die to the substrate.

21. The device of claim 15, wherein the die is a flip chip and wherein the electrical coupling comprises a solder for coupling the die to the substrate.

22. The device of claim 15, wherein the sensor is selected from a group consisting of a pressure sensor, a microphone, or a temperature sensor.

23. The device of claim 15 further comprising an attachment coupled to device, wherein the attachment is selected from a group consisting of a gasket or an O-ring, and wherein the attachment is configured to integrate the device into a second device and further to isolate interior of the second device from external environment.

24. A device comprising:
a die;
a substrate coupled to the die; and
a packaging container, wherein the packaging container and the substrate form a housing for the die, and wherein the housing forms an interior portion and an exterior portion, wherein the exterior portion is exposed to external environment and wherein the interior portion is isolated from the external environment,
wherein the exterior portion is coated with a conformal film, wherein the conformal film prevents liquid material intrusion into the housing.

25. The device of claim 24, wherein a thickness of the conformal film ranges between 10 Å and 5 micron meters.

26. The device of claim 24, wherein the conformal film is selected from a group consisting of Parylene or polymer comprising glass powder, or ceramic powder.

27. The device of claim 24 further comprising a die attach material configured to couple the die to the substrate.

28. The device of claim 24, wherein the die further comprises a wire bond configured to electrically connect the die to the substrate.

29. The device of claim 24, wherein the die is a flip chip for coupling the die to the substrate.

30. The device of claim 24, wherein the die comprises a medical device diagnostic electronics and wherein the environment external to the die is within a human body.

* * * * *